United States Patent
Ference et al.

(10) Patent No.: US 6,838,749 B2
(45) Date of Patent: Jan. 4, 2005

(54) STRUCTURES FOR INCREASING THE CRITICAL TEMPERATURE OF SUPERCONDUCTORS

(75) Inventors: Thomas G. Ference, Essex Junction, VT (US); Kenneth A. Puzey, Essex Junction, VT (US)

(73) Assignee: Teracomm Research, inc., Essex Junction, VT (US)

( * ) Notice: Subject to any disclaimer, the term of this patent is extended or adjusted under 35 U.S.C. 154(b) by 0 days.

(21) Appl. No.: 10/679,729

(22) Filed: Oct. 6, 2003

(65) Prior Publication Data

US 2004/0220057 A1 Nov. 4, 2004

Related U.S. Application Data

(62) Division of application No. 09/713,894, filed on Nov. 16, 2000, now Pat. No. 6,630,426.
(60) Provisional application No. 60/175,701, filed on Jan. 12, 2000.

(51) Int. Cl.$^7$ .............................................. H01L 39/00
(52) U.S. Cl. ...................................... 257/661; 257/663
(58) Field of Search ................................. 257/661–663

(56) References Cited

U.S. PATENT DOCUMENTS 5,747,426 A * 5/1998 Abboud ...................... 505/166

* cited by examiner

*Primary Examiner*—Fetsum Abraham

(57) ABSTRACT

A method for increasing the critical temperature, $T_c$, of a high critical temperature superconducting (HTS) film (104) grown on a substrate (102) and a superconducting structure (100) made using the method. The HTS film has an a-b plane parallel to the surface of the substrate and a c-direction normal to the surface of the substrate. Generally, the method includes providing the substrate, growing the HTS film on the substrate and, after the HTS film has been grown, inducing into the HTS film a residual compressive strain the a-b plane and a residual tensile strain into the c-direction.

12 Claims, 13 Drawing Sheets

STRUCTURES FOR INCREASING THE CRITICAL TEMPERATURE OF SUPERCONDUCTORS

RELATED APPLICATIONS

This is a divisional of U.S. patent application Ser. No. 09/713,894 filed Nov. 16, 2000, which claims the benefit of Provisional Application No. 60/175,701, filed Jan. 12, 2000.

FIELD OF INVENTION

The present invention relates generally to the field of superconductors. More particularly, the present invention is directed to a method of increasing the critical temperature of a superconducting film by inducing residual strains into the film. The present invention is also directed to a superconducting structure made in accordance with the foregoing method.

BACKGROUND OF THE INVENTION

High critical temperature superconducting (HTS) films have important applications in, e.g., microwave, electronic and optical devices. Presently, however, useful applications for HTS films are limited by the relatively low critical temperatures that have been achieved by conventional HTS film growth. Devices comprising conventional HTS films must be cooled to the films' low operating temperatures using, e.g., a Stirling cycle refrigerator or a Gifford-McMahon-type cryocooler. Currently, typical refrigerators of this type have mean times between failure (MTBFs) of about 4,000 hours, the most reliable models having MTFBs of 150,000 hours, or about 17.5 years. Drawbacks of these refrigerators are that they are expensive and are much less reliable than desired.

Increasing the critical temperature, $T_c$, of HTS films to 160 K or above would allow them to be cooled inexpensively and reliably. As a result, the use of HTS films could become more widespread. Cooling to 160 K could be provided by highly reliable solid state thermoelectric coolers that operate based on the Seebeck effect. MTFBs of 200,000 to 300,000 hours (34 years) are commonplace among such thermoelectric coolers. Furthermore, these devices are inexpensive, widely used and readily available. Another benefit that would be realized from being able to use thermoelectric coolers is that the power required to cool an HTS device having a Tc greater than 160 K would be relatively small compared to a conventionally cooled HTS device. Therefore, operating costs of thermoelectrically cooled HTS devices would be lower.

As reported in the CRC Handbook of Chemistry and Physics, $80^{th}$ Edition, pp. 12-91 to 12-92, CRC Press LLC (1999), the present record for the highest $T_c$ of an HTS film is 133 K, which is held by a mercury-based copper oxide superconducting compound. Critical temperatures of other HTS materials may also be found in the foregoing reference. In Gao et al., "Superconductivity up to 164 K in HgBa-CaCuO under quasi-hydrostatic pressures," Physical Review B, Vol. 50, pp. 4260–63, The American Physical Society (1994), it was reported that the $T_c$ of the subject compound can be increased to 164 K by applying 300,000 atmospheres of hydrostatic pressure to it. This hydrostatic pressure effect has also been observed in other superconducting compounds, including the lanthanum, bismuth and thalium compounds, and to a lesser degree in yttrium compounds. While these increases are of scientific interest, they are not suitable for practical applications.

Recently, J. Loquet et al. reported in "Doubling the critical temperature of LaSrCuO using epitaxial strain," Nature, Vol. 394, 1998, pp. 453–56, that greater increases in $T_c$ can be achieved by inducing compressive strain into the a-b plane of the HTS film by growing the HTS film pseudomorphically on a substrate having a lattice constant smaller than the lattice constant of the bulk HTS material, rather than by applying hydrostatic pressure. To achieve the relatively large increases in $T_c$ that are desirable for allowing the use of less expensive and more reliable cooling apparatus, a relatively large lattice mismatch between the HTS film and the substrate is required.

However, such a large lattice mismatch causes problems in growing a high quality, low defect HTS film. For example, a large lattice mismatch increases the energy of formation required for the lattice structure of the HTS film to conform to the lattice structure of the substrate. This increase in energy increases the likelihood that defects, such as dislocations, will occur in the HTS film during its growth. Such defects can degrade the superconducting properties of the HTS film and decrease the strain in the film. Therefore, it is desirable to grow an HTS film at the lowest energy of formation as possible to achieve the highest quality film.

Conventional pseudomorphic epitaxy, however, cannot achieve the desired low energy of formation and thus places severe limitations on the thickness of an HTS film having its $T_c$ increased via a lattice mismatch between the substrate and HTS film. As the magnitude of the lattice mismatch increases, the maximum thickness to which a high quality film can be grown decreases. The lattice mismatch induces strain into the HTS film within only about the first few hundred angstroms of thickness adjacent the substrate. Beyond these first few hundred angstroms, the strain in the HTS film caused by the lattice mismatch is significantly diminished due to dislocations. These limitations on HTS film thickness may not be compatible with a desired application. For example, in some applications, such as microwave filters and current fault limiters, among others, it is desired that the thickness of the HTS film be on the order of 1000 Å or more. It is, therefore, desirable to induce the $T_c$ raising strains into an HTS film after it has been grown at the lowest energy of formation possible so that the problems of pseudomorphic epitaxy are avoided.

Belenky et al. have reported, in "Effect of stress along the ab plane on the $J_c$ and $T_c$ of YBa2Cu307 thin films," Physical Review B, Vol. 44, No. 10, pp. 10, 117–120, The American Physical Society (1991), that the $T_c$ of a thin $YBa2Cu_3O_7$ film grown on a substrate to form a composite structure can be changed from the unstrained $T_c$ by bending the composite structure to induce a stress into the HTS film. For their experiment, one end of the composite structure was clamped into a fixed support such that a portion of the composite structure was cantilevered from the fixed support. Then, external forces were alternatingly applied to the composite structure adjacent the free end of the cantilevered portion in a direction normal to the HTS film to alternatingly induce compression and tension into the a-b plane of the HTS film. Belenky et al. found that inducing compression along the a-b plane leads to an increase in $T_c$ above the unstrained $T_c$, and, conversely, that inducing tension along the a-b plane leads to a decrease in $T_c$ below the unstrained $T_c$. While these results are of experimental interest, the temporary strains induced into the HTS film are of no value to practical HTS film devices.

In order to facilitate an understanding of the present invention, following is a presentation of orientation conventions, terminology, equations and empirical data used in the present specification and/or claims appended hereto. It is noted that Equations {1}–{8} appearing below are generally valid only for relatively small magnitudes of strain, i.e., where the relationship between strain and $T_c$ is generally linear. These equations may not adequately describe the relationship between strain and $T_c$, for larger magnitudes of strain, wherein the relationship between strain and $T_c$ may be non-linear. Thus, Equations {1}–{8} are presented only to illustrate the general concepts embodied in the various aspects of the present invention.

FIG. 1A shows the relative orientation of the a, b and c directions/axes and a-b plane with respect to a unit 20 of simple cubic crystal lattice structure, and FIG. 1B shows the relative orientation of the a, b and c directional axes and a-b plane of an HTS film 22 grown on a substrate 24. FIGS. 2A and 2B illustrate, respectively, HTS film 22 epitaxially grown commensurate with respect to substrate 24 and, in the alternative, epitaxially grown pseudomorphic with respect to substrate 24. HTS film 22 in FIG. 2A is denoted a commensurate film, characterized in that the b-direction lattice constant $K_{s_b}$ of substrate 32 is equal to the bulk b-direction lattice constant of the HTS material from which HTS film 22 is formed. Thus, when HTS film 22 is grown, its in situ lattice constant $K_{f_b}$ is equal to lattice constant $K_{s_b}$ of substrate 24 so that no strain is induced in HTS film 22 by a lattice mismatch. Since there is no strain in the b-direction, there is no strain in the c-direction base d upon the Poisson effect and, therefore, c-direction lattice constant $K_{f_c}$ of HTS film 22 remains unchanged from its bulk value.

In contrast, HTS film 22 in FIG. 2B is denoted a pseudomorphic film due to the fact that its in situ b-direction lattice constant $K'_{f_b}$ is different from its bulk value due the HTS film being grown on a substrate having a b-direction lattice constant $K'_{s_b}$ different from the bulk b-direction lattice constant of the HTS material used to form HTS film 22. As HTS film 22 is grown, the lattice structure of HTS film 22 generally conforms to the smaller lattice structure of substrate 24. The decrease in b-direction lattice constant $K'_{f_b}$ of HTS film from its bulk, or unstrained, value induces a compressive strain into the HTS film in the a-b plane. Due to the Poisson effect, and since HTS film 22 is unconstrained in the c-direction, the compressive strain in the a-b plane causes the c-direction lattice constant $K'_{f_c}$ to increase over its bulk value, thus inducing a corresponding tensile strain in the HTS film in the c-direction direction.

For many of the copper superconducting compounds it is known that the $T_c$ rises for compressive stress in the a-b plane and falls for compressive stress in the c-direction. Under hydrostatic pressure, the HTS film is under compressive stress in both the a-b plane and c direction, and, thus, any increase in $T_c$ due to the compressive stress in the a-b plane tends to be canceled by the decrease caused by the compressive stress in the c direction. However, as described above, for pseudomorphic HTS film grown epitaxially on a substrate having a lattice constant smaller than the lattice constant of the unstained HTS film, the a-b plane is under compressive (positive) strain and the c plane is under a tensile (negative) strain. Thus, under pseudomorphic conditions, the changes in $T_c$ of the aforementioned copper oxide compounds are additive to one another and lead to a larger increase in $T_C$ when compared to a hydrostatic pressure scenario. Similarly, with respect to lanthanum-based superconducting compounds, inducing a compressive strain in the a-b plane and a corresponding tensile strain in the c direction has been observed to double the $T_c$.

The strain within an HTS thin film grown epitaxially on a substrate is given by the equation:

$$\epsilon_a = d_B - d_{Sub}/d_B \qquad 1$$

where $\epsilon_a$ is the strain in the a-direction, $d_B$ is the lattice constant of the bulk superconducting material and $d_{Sub}$ is the lattice constant of the substrate in the a-direction. The strain in the b-direction can be obtained using the same formula and replacing the a-direction lattice constants of the respective material with the corresponding b-direction lattice constants. For many superconducting materials, the a-direction and b-direction lattice constants are nearly the same. As stated above, strain in the a-b plane also gives rise to strain in the c-direction due to the Poisson effect. Thus, the strain in the c-direction is given by the equation:

$$\epsilon_c = -2\sigma \epsilon_a \qquad 2$$

where $\epsilon_c$ is the strain in the c-direction, $\sigma$ is Poisson's ratio for HTS material and $\epsilon_a$ is the strain in the a-direction. Note that the strain in the c-direction has the opposite sign of the strain in the a (or b)direction.

The critical temperature, $T_c$, of an HTS film as a function of epitaxial strain is given by the equation:

$$T_c = T_c(0) + (\delta T_c/\delta \epsilon_a)\epsilon_a + (\delta T_c/\delta \epsilon_b)\epsilon_a + (\delta T_c/\delta \epsilon_c)\epsilon_c \qquad 3$$

where $T_c(0)$ is the critical temperature of the HTS material in the absence of strain, $\delta T_c/\delta \epsilon_x$ is the derivative of the critical temperature with respect to the strain in the x-direction, $\epsilon_x$ is the strain in the x-direction and the subscripts a, b, c refer to the respective x-direction.

The stress in an epitaxial HTS film is related to the strain by Hooke's law and the Poisson effect as shown in the following equation:

$$\Delta P_a = Y \epsilon_a/(1-\sigma) \qquad 4$$

where $\Delta P_a$ is the stress in the a-direction, Y is Young's modulus of the HTS material, $\epsilon_a$ is the strain in the a-direction and $\sigma$ is Poisson's ratio. The stress in the b-direction uses the same equation except the subscripts are changed to b to indicate that the corresponding terms are for the b-direction. The stress in the c-direction is given by the equation:

$$\Delta P_c = Y\epsilon_a/(-2\sigma) \qquad 5$$

where $\Delta P_c$ is the stress in the c-direction and e, is the corresponding strain in the a-direction. It is noted that the stress in the c-direction has the opposite sign of the stress in each the a and b-directions.

The critical temperature, $T_c$, of a HTS thin film as a function of stress is given by the equation:

$$T_c = T_c(0) + (\delta T_c/\delta P_a)\Delta P_a + (\delta T_c/\delta P_b)\Delta P_b + (\delta T_c/\delta P_c)\Delta P_c \qquad 6$$

where $T_c(0)$ is the critical temperature of the HTS film in the absence of stress, $\delta T_c/\delta P_x$ is the derivative of the critical temperature with respect to the stress in the x-direction, $\Delta P_x$ is the stress in the x-direction and the subscripts a, b, c refer to the respective x-direction.

The expected increase in critical temperature per unit stress, $\Delta T_{c_e}$, for epitaxial stress in the a-b plane is given by the equation:

$$\Delta T_{c_e} = 2dT_c/dP_{ab} - dT_c/dP_c \qquad 7$$

where $dT_c/dP_{ab}$ and $dT_c/dP_c$ are the derivatives of the critical temperature with respect to the stress in the a-b plane and the stress in the c-direction, respectively. In contradistinction, however, the expected increase in critical temperature per unit stress, $\Delta T_{c_h}$, for the hydrostatic pressure case is given by the equation:

$$\Delta T_{c_h} = 2dT_c/dP_{ab} + dT_c/dP_c \qquad 8$$

where the terms are the same as for the epitaxial strain case. It is significantly noted that the signs of the operators preceding the term of each of Equations {7} and {8} are opposite one another.

The $T_c$ derivatives with respect to strain and the expected increases in critical temperature for each of the hydrostatic pressure and epitaxial strain cases are listed in TABLE 1 for several bismuth copper oxide HTS materials. TABLE 1 indicates that large increases in critical temperature are expected for films under compressive epitaxial strain. Furthermore, these expected increases are much larger than the expected increases under hydrostatic pressure.

| Material | $dT_c/dP_{ab}$ (K/Gpa) | $dT_c/dP_c$ (K/GPa) | $\Delta T_{c_h}$ (K/GPa) | $\Delta T_{ce}$ (K/GPa) |
|---|---|---|---|---|
| BiSrCaCuO-2212 | 1.8 | −2.8 | +0.8 | 6.4 |
| Bi(Pb)SrCaCuO-2212 | 10 | −18.5 | +1.5 | 38.5 |
| Bi(Pb)SrCaCuO-2223 | 6.2 | −18.5 | −6.1 | 30.9 |

For most copper oxide HTS materials, the derivative of the critical temperature with respect to pressure is positive in the a and b-directions and negative in the c-direction. When an epitaxial HTS film is grown under compressive strain, the film in the a and b-directions is under compressive strain and the film in the c-direction is under tensile strain. Thus, for most HTS films grown under compressive strain in the a and b-direction, the a and b-direction derivatives and strains are positive and the c-direction derivative and strain are negative. Therefore, the a, b and c derivatives constructively add with one another to increase the critical temperature of the HTS film. Conversely, an epitaxial HTS film grown under tensile strains in the a and b-directions would experience a commensurate decrease in critical temperature. In contradistinction, when HTS film is subject to hydrostatic pressure in the c-direction, the $T_c$ derivative term in the c-direction tends to cancel the $T_c$ derivative terms in the a and b-directions, reducing the magnitude of the change in critical temperature.

SUMMARY OF THE INVENTION

The present invention is generally directed to a method of increasing the critical temperature, $T_c$, of an HTS film grown on a substrate by inducing into the HTS film a residual compressive strain in the a-b plane and a residual tensile strain in the c-direction after the HTS film has been grown on the substrate.

Accordingly, in one aspect, the invention is directed to a method of increasing the $T_c$ of an HTS film having an a-b plane and a c-direction. The method includes providing a substrate having a first face and a second face spaced from the first face and growing the HTS film on the first face of the substrate such that the a-b plane is parallel to the first face and the c-direction is normal to the first face. The method further includes, subsequent to growing the HTS film, inducing into the HTS film a residual compressive strain in the a-b plane and a residual tensile strain in the c-direction.

In another aspect, the invention is directed to a method for increasing the $T_c$ of an HTS film having an a-b plane. The method includes providing a substrate having a first face and a second face spaced from the first face and inducing a bow into the substrate such that the first face undergoes a change in curvature. Then, the HTS film is epitaxially grown on the first face such that the a-b plane is parallel to the first face and the bow imparted into the substrate is at least partially released such that a residual strain is introduced into the a-b plane of the HTS film.

In yet another aspect, the invention is directed to a method of increasing the $T_c$ of an HTS film having an a-b plane. The method includes providing a substrate having a first face and a second face spaced from the first face. Then, the HTS film is epitaxially grown on the first face of the substrate to form a composite structure. The a-b plane is parallel to the first face. The composite structure is then bowed to induce a strain into the a-b plane of the HTS film.

In an additional aspect, the present invention is directed to a superconducting structure comprising a substrate having a surface and an HTS film grown on the surface. The HTS film has an a-b plane parallel to the surface and a c-direction normal to the surface. The HTS film also has a residual compressive strain in the a-b plane and a residual tensile strain in the c-direction, wherein the residual compressive and tensile strains are not caused by a lattice mismatch between the substrate and the HTS film.

In another additional aspect, the present invention is directed to a superconducting structure comprising a substrate and an HTS film grown on the surface. The HTS film has a thickness normal to the surface, an a-b plane parallel to the surface and a c-direction normal to the surface. The thickness is greater than the maximum thickness to which the HTS film can be pseudomorphically grown before pseudomorphic strain is released by dislocations occurring in the HTS film. The HTS film has a residual compressive strain in the a-b plane and a residual tensile strain in the c-direction that are generally uniform throughout the thickness.

BRIEF DESCRIPTION OF THE DRAWINGS

For the purpose of illustrating the invention, the drawings show forms of the invention that are presently preferred. However, it should be understood that this invention is not limited to the precise arrangements and instrumentalities shown in the drawings.

DETAILED DESCRIPTION OF THE INVENTION

Figure 1A:
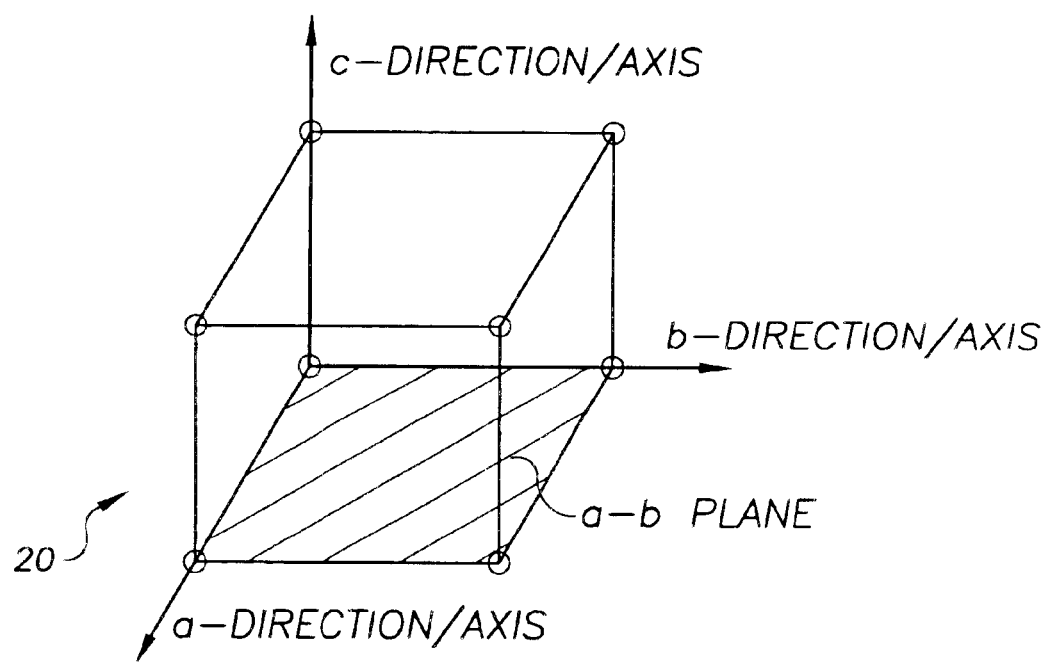
FIGS. 1A and 1B show, respectively, crystal unit cell axes with respect to a simple cubic, or isometric, crystalline lattice structure and the crystal unit cell axes of an HTS film grown epitaxially on a substrate.
Figure 1B:
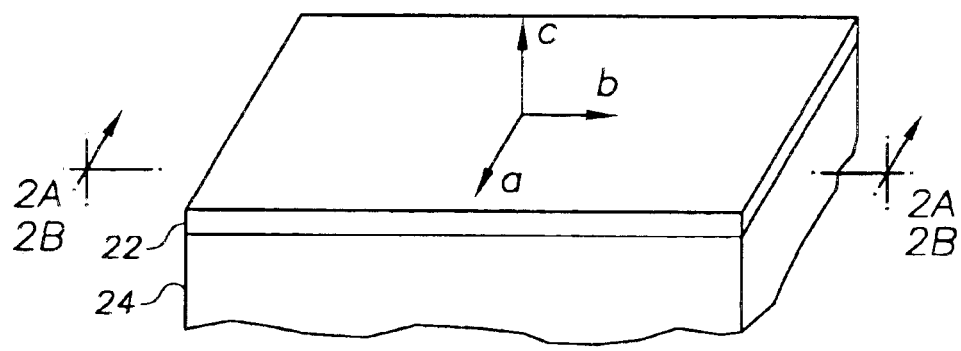
Figure 2A:
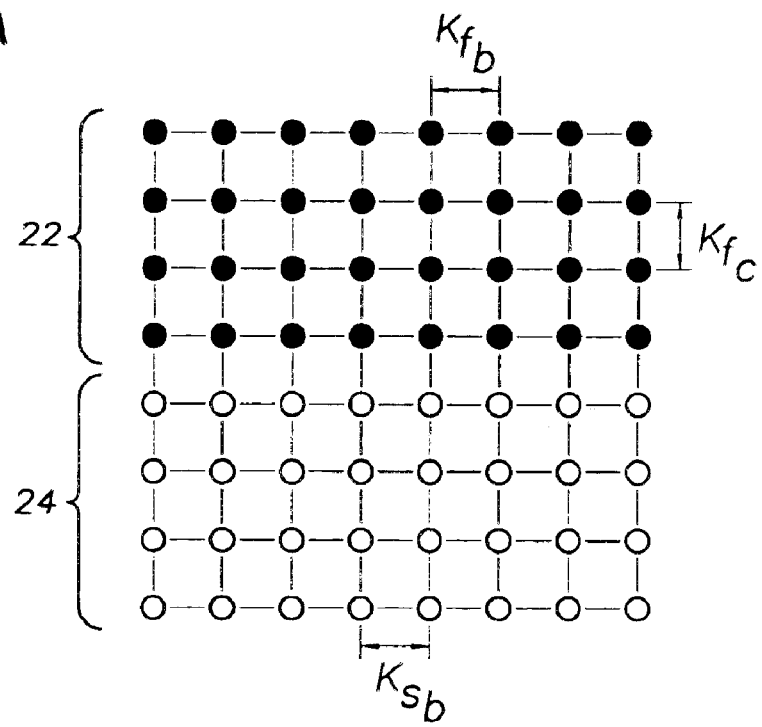
FIGS. 2A and 2B are partial cross-sectional views taken along lines 2A–2A and 2B–2B of FIG. 1A illustrating, respectively, a commensurate HTS film and a pseudomorphic HTS film.
Figure 2B:
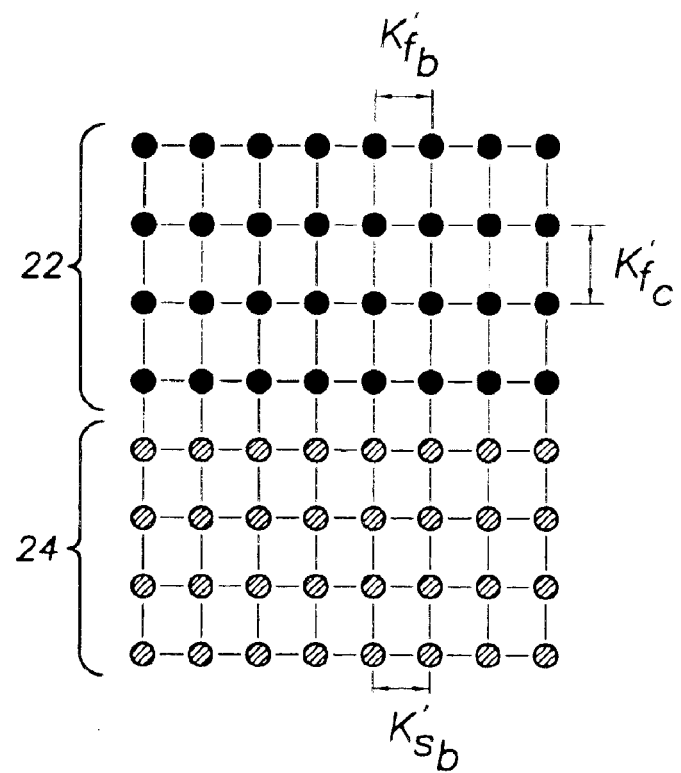
Figure 3:
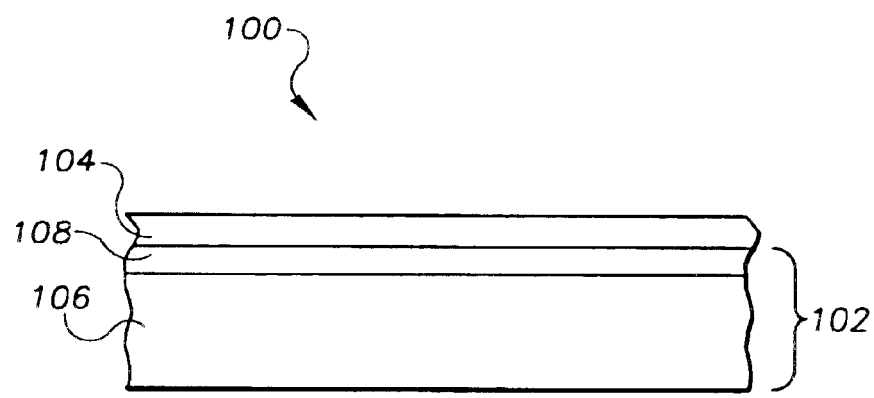
FIG. 3 is a partial cross-sectional view of a superconductor structure formed in accordance with the present invention

Referring now to the drawings, wherein like elements are indicated by like numerals, there is illustrated in FIG. 3 in accordance with the present invention an exemplary superconductor structure, which is denoted generally by the numeral 100. Superconductor structure 100 may be used to form any number of superconducting devices, such as superconducting tape/wire, microwave filters, superconducting quantum interference devices (SQUIDS), optical modulators, broadband detectors (Bolometers), high-speed electronic Josephson junctions and rapid single flux quantum (RSFQ) logic, among others.

Superconductor structure 100 includes a substrate 102 and an HTS film 104 grown on the substrate. HTS film 104 may comprise of any one of a number of superconducting materials, such as copper oxide compounds comprising yttrium, bismuth, thallium, lanthanum or mercury. As used herein and in the claims appended hereto, the term "substrate" denotes the entirety of the structure on which HTS film 104 is grown. Thus, in FIG. 3 substrate 102 consists of a substructure 106 and a buffer layer 108. Substructure 106 may be a layer consisting of a conventional wafer or may comprise a wafer or other support structure and one or more other layers. Substrate 102 may also comprise a single layer, such as a wafer. One skilled in the art will understand the variety of support structures and/or other layers that may form substrate 102 upon which HTS films 104 may be grown.

If required, buffer layer 108 is grown on substructure 106 to provide one or more functions beneficial to superconducting structure 100. For example, buffer layer 108 may be provided as a barrier to prevent the indiffusion into HTS film 104 of elements from the substructure that are detrimental to the superconducting properties of the HTS film. Buffer layer 108 may additionally, or alternatively, be provided to have a lattice constant intermediate the lattice constants of substructure 106 and HTS film 104 to reduce the energy of formation of the HTS film so that the HTS film may be of a high quality.

An example of a known material suitable for buffer layer 108 is yttria-stabilized zirconia (YSZ). YSZ as a buffer layer has the advantage that it can be grown on silicon, which is a well understood material widely used in the microelectronics industry. As a result, an HTS Film grown on a YSZ buffer layer on top of silicon can be more easily integrated with other devices. YSZ is resistant to most chemicals making it a convenient etch stop for patterning an HTS film, as described below. In addition, YSZ is transparent in the far infrared wavelengths, a characteristic that is particularly important for detector and optical modulator applications of HTS devices.

In accordance with the various aspects of the present invention, described below, at least a portion of HTS film 104 contains a residual compressive (positive) strain in its a-b plane and a corresponding residual tensile strain in its c-direction resulting from the Poisson effect that together increase the $T_C$ of the strained portion of the HTS film above the $T_c$ of the unstrained HTS material. As used herein, the terms "residual compressive strain" and "residual tensile strain" mean lasting strains induced into the HTS film using any one of the aspects of the present invention and wherein the residual strains are not caused by external forces applied temporarily to superconducting structure 100.

In a preferred embodiment of the present invention, HTS film 104 should be grown as commensurate with buffer layer 108 as possible so that the energy of formation of the HTS film is minimized. In this manner, HTS film 104 can achieve the highest quality. A film is "commensurate," as used herein, with another film or substrate when the lattice constants of the films or film and substrate are identical. Unless the films or film and substrate are homoepitaxial with one another, it is difficult to grow a perfectly commensurate film, partly due to the difficulty in achieving an exact match between the lattice constants of the HTS film and substrate made of a different material. Thus, as used herein, a heteroepitaxial film is substantially commensurate when the energy of film formation is as small as practicable.

After HTS film 104 has been grown on buffer layer 108, the state of strain throughout the entire thickness of the HTS film, or a portion of the HTS film, is changed by inducing residual strains into the HTS film using one or more of the aspects of the present invention, as more fully described below. These residual strains allow HTS film 104 to achieve a higher critical temperature and/or a greater effective, or strained, thickness than could be obtained using conventional methods, namely, pseudomorphic epitaxy and hydrostatic pressure. Although the present invention is described in connection with epitaxially grown HTS films, one skilled in the art will recognize that the methods of the present invention are equally applicable to non-epitaxially grown, grain oriented, films.

A first aspect of the present invention for increasing the $T_C$ of an HTS film comprises steps of bowing the substrate upon which the HTS film is to be grown, growing the HTS film on the convex face of the bowed substrate to form a composite structure and then releasing the bow in the composite structure. In a preferred embodiment, the amount of bow and the lattice constant of the substrate are determined such that when the HTS film is being grown upon the bowed substrate, the lattice constant of the convex face of the substrate matches the bulk lattice constant of the HTS material that forms the HTS film so that the HTS film may be grown commensurate with the substrate. In this manner, the energy of formation of HTS film is minimized and a high quality HTS film is achieved. Although it is presently preferred to grow only an HTS film while the substrate is bowed, at least one other layer, such as a buffer layer, may be grown on the bowed substrate before growing the HTS film and before releasing the bow.

As the substrate is bowed, the lattice structure of the substrate is stretched at the convex surface of the substrate, increasing the lattice constant at the convex surface. The HTS film is then grown on the substrate. After growing the HTS film, the bow in the composite structure is released, thereby reducing the lattice constants of the substrate in the region of the convex face and the HTS film throughout its entire thickness, inducing a residual compressive strain into the HTS film in the a-b plane and a commensurate residual tensile strain in the c-direction. These residual strains are generally uniform throughout the thickness of the HTS film and significantly increase the $T_c$ of the film above the $T_C$ of the unstrained film.

To facilitate the first aspect of the present invention, the substrate may be bowed using a number of techniques. For example, as shown in FIGS. 4A–4D, a bow can be induced into a substrate 200 by placing the substrate into a jig 202 having an arcuate surface 204, such as a spherical surface, and hold-downs 206 for securing the substrate in a bowed configuration against the arcuate surface. In this example, substrate 200 comprises a wafer 208 and a buffer layer 210 epitaxially grown on the wafer before the substrate is inserted into the jig. However, wafer 208 may be placed into jig 202 prior to growing buffer layer 210, in which case the buffer layer is grown upon the bowed wafer.

Figure 4A:
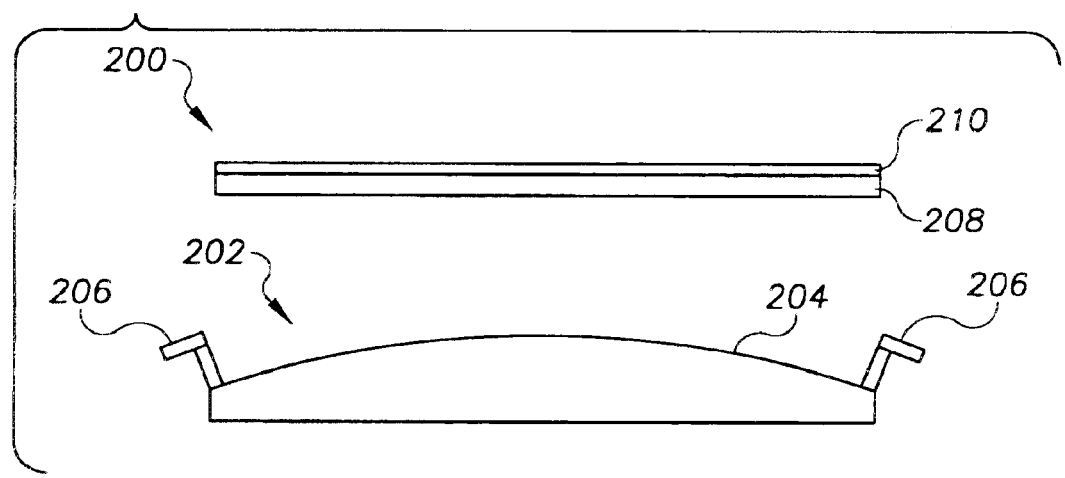
FIGS. 4A–4D are a sequence of elevational views of one embodiment of a first aspect of the present invention, wherein the $T_c$ of an HTS film is increased by first imparting a bow to a substrate using a jig.
Figure 4B:
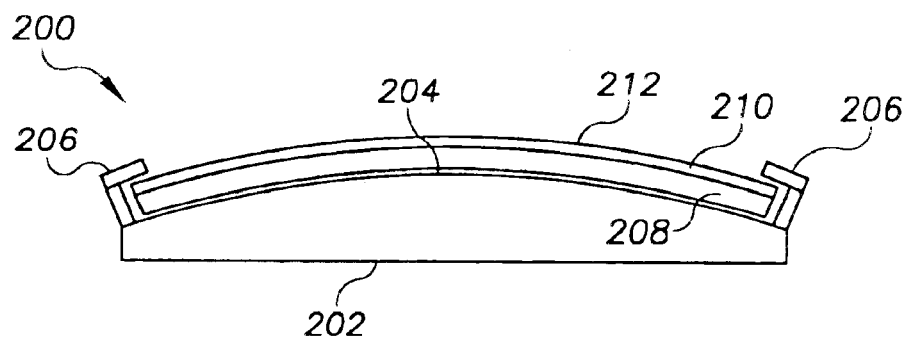
Figure 4C:
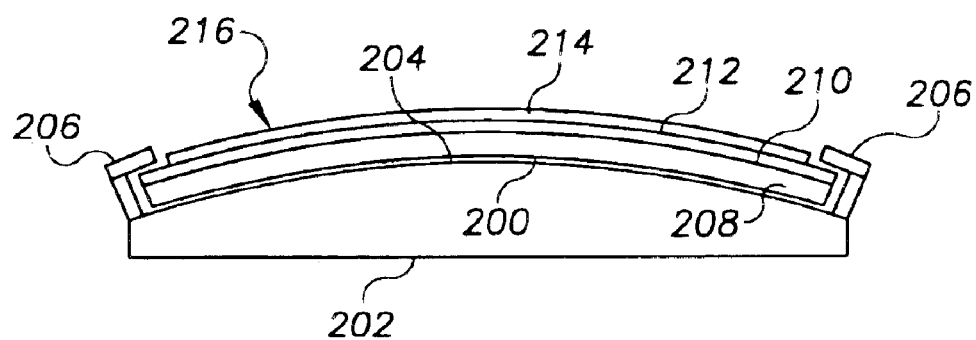

Substrate 200 is inserted into jig 202 by bringing the bottom face of substrate 200 into contact with arcuate surface 204, pressing the substrate against the arcuate surface and moving hold-downs 206 into contact with the upper, or convex, surface 212 of the substrate. As substrate 200 is bowed, its lattice structure at convex surface 212 is expanded, thereby increasing the lattice constant there. While substrate 200 is bowed, an HTS film 214 is grown, preferably epitaxially and commensurate with the substrate, on convex surface 212 to form a composite structure 216, as shown in FIG. 4C.

Figure 4D:
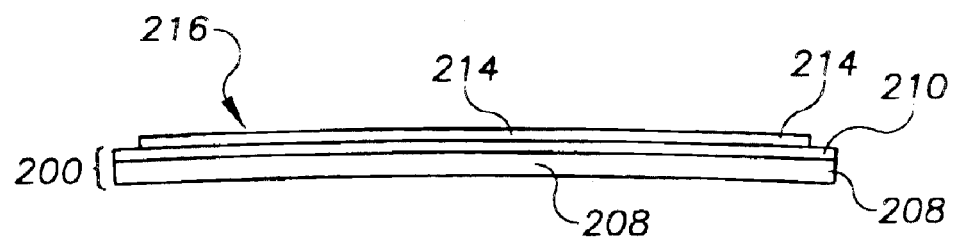

After HTS film 214 has been grown, composite structure 216 is removed from jig 202, whereupon the bow in the composite structure substantially relaxes, as shown in FIG. 4D. As the bow relaxes, the lattice structure of substrate 200 at convex surface 212 is compressed, reducing the lattice constant there. As the lattice structure of substrate 200 is compressed, the lattice structure of HTS film 214 is compressed commensurately generally throughout the entire thickness of the HTS film, thereby inducing a residual compressive strain into the a-b plane of the HTS film and, by virtue of the Poisson effect, inducing a commensurate residual tensile strain in the c-direction of the HTS film. These increases in residual strain in HTS film 214, in turn, increase the $T_c$ of the HTS film. One skilled in the art will understand that jig 202 is merely exemplary and that any one of a number of apparatuses may be used in the spirit of the present invention to induce a bow into the substrate.

As shown in FIGS. 5A–D, another method for inducing a bow into a substrate 300 includes depositing a tensioning film 302 onto the backside 304 of the substrate prior to growing an HTS film 306 on the convex surface 308 of the substrate. U.S. Pat. No. 4,830,984, which is incorporated herein by reference, discusses in detail providing tensioning films and also discloses a variety of materials that may be used for tensioning Film 302. Preferred materials for tensioning film 302 include metal (or refractory) silicides and, more preferably, tungsten silicide and titanium silicide. Additional preferred metal silicides include tantalum silicides, molybdenum silicides, cobalt silicides and nickel silicides. One reason for using these metal silicides is that they have a relatively high coefficient of thermal expansion compared to silicon, which is a preferred material for the support layer of substrate 300. Hence, a relatively thin film of a metal silicide may be used on backside 304 of the substrate 300 to impart a significant bow to the substrate that imparts a tensile strain within, and increases the lattice constant of, the substrate at convex surface 308 prior to growing HTS film 306. Other materials, such as tensile silicon nitride, may also be used for tensioning film 302.

Figure 5A:
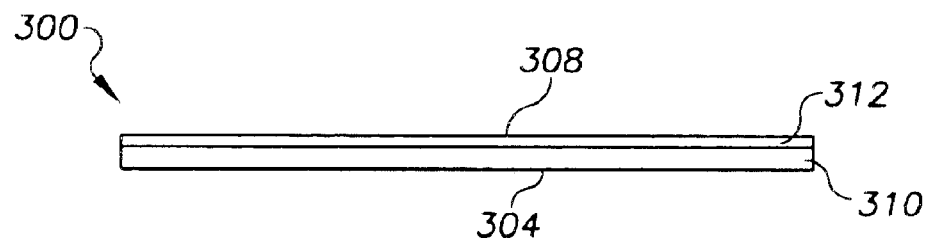
FIGS. 5A–5D are a sequence of elevational views of an alternative embodiment of the first aspect of the present invention, wherein the $T_c$ of an HTS film is increased by first imparting a bow to a substrate using a tensioning film applied to the substrate.
Figure 5B:
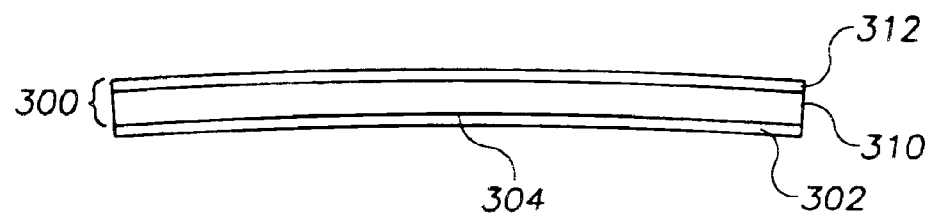
Figure 5C:
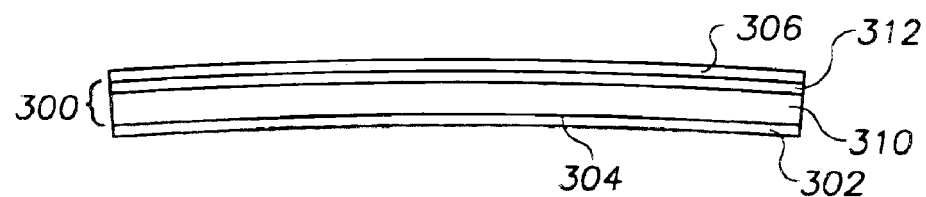

FIG. 5A shows substrate 300, which includes a wafer 310 and a buffer layer 312, prior to deposition of tensioning film 302, FIG. 5B shows substrate 300 after tensioning film 302 has been deposited and FIG. 5C shows substrate 300 immediately after HTS film 306 has been epitaxially grown on the substrate. Although it is presently preferred that buffer layer 312 be present prior to depositing tensioning film 302, one skilled in the art will recognize that wafer 310 may be bowed prior to depositing buffer layer 312. In addition, buffer layer 312 may not be required, and therefore eliminated, in some applications.

Figure 5D:
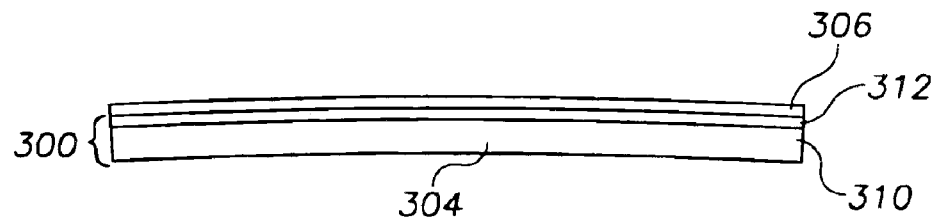

After HTS film 306 has been grown, preferably epitaxially and commensurate with buffer layer 312, tensioning film 302 is removed from substrate 300, e.g., by grinding, dry etching, wet etching or chemical mechanical polishing. FIG. 5D shows substrate 300 and HTS film 306 after tensioning film has been removed. Removing tensioning film 302 allows the lattice structure of substrate 300 at convex surface 308 to contract substantially back to its pre-bowed state. As the lattice structure of substrate 300 contracts, a residual compressive strain is induced into the HTS film in the a-b plane throughout the thickness of the HTS film. Due to the Poisson effect, a corresponding residual tensile strain is induced into the c-direction of HTS film. These residual strains, in turn, induce a corresponding increase in the $T_C$ of the HTS film above that of the unstrained HTS film.

After the bow is released, e.g., by removing composite structure 206 from jig 202 or removing tensioning film 302 from backside 304 of substrate 300, substrate 200, 300 and corresponding HTS film 214, 306 may retain a final bow since the addition of one or more layers to the substrate while it its bowed increases the section modulus of the composite structure. Typically, the thickness of the substrate is large compared to that of the HTS film so that any residual bow is negligible. However, if the final bow interferes with subsequent processing of the composite structure, a compressive film may be added to the backside of the substrate. In addition, it may be desirable to add a compressive film to the backside of the substrate to induce further residual strain into the HTS film to further increase the $T_C$ of the HTS film.

In another embodiment (not shown), an HTS film may first be grown on an unbowed substrate to form a composite structure and then a bow be imparted to the composite structure. For example, the HTS film may be grown commensurate with the substrate, thus minimizing the energy of formation of the HTS film and growing a generally stress-free HTS film. Then, residual compressive and tensile strains may be introduced into the HTS film by bowing the composite structure, e.g., using a jig or other apparatus or applying a compressing film to the face of the substrate opposite the HTS film.

The foregoing aspect of the present invention may also be used to grow quality heteroepitaxial films, i.e., films that are substantially dislocation free and made of materials different from the substrate material, to thicknesses greater than achievable using conventional film epitaxy techniques. For example, in the microelectronics industry it is desirable to grow films made of various materials other than silicon on silicon substrates. Often, however, the lattice mismatch between a bulk film material and the substrate is so great that a high energy of formation is required to grow a film. Such a high energy of formation can cause dislocations that severely limit the thickness to which a quality film may be grown. Since useful applications for some films require quality films to be thicker than achievable by conventional epitaxy, these applications are not possible. Although the foregoing example is directed to silicon substrates, one skilled in the art will recognize that the present aspect may be used with many different substrate and film materials where it is desired to grow epitaxial films upon the substrates.

The present aspect may be used to achieve quality films having thicknesses greater than can be achieved by conventional epitaxy by reducing the energy of formation of the films. This is accomplished by bowing a substrate, prior to growing a film, in a manner such that the lattice constant at the growth surface of the substrate more closely matches the bulk lattice constant of the material used to grow the film. For example, for a film material having a bulk lattice constant larger than the surface lattice constant of the unbowed substrate, the substrate is bowed so that its growth surface is convex. While the substrate is being bowed thusly, the lattice structure at the growth surface is stretched, increasing the surface lattice constant at the growth surface closer to the lattice constant of the bulk film material. Conversely, for a film having a bulk lattice constant smaller than the surface lattice constant of the unbowed substrate, the substrate is bowed so that its growth surface is concave. While the substrate is being bowed thusly, the lattice structure at the growth surface is compressed, decreasing the surface lattice constant at the growth surface closer to the lattice constant of the bulk film material.

Since the surface lattice constant of the bowed substrate more closely matches the lattice constant of the bulk film material, the film is grown at a lower energy of formation that results in fewer, or no, defects that lead to the ability to grow a thicker quality film than achievable by growing the film on the substrate in an unbowed state. Any of the above-described embodiments may be used for achieving relatively thick quality films. For example, the substrate may be bowed using a suitable jig or applying a tensioning or compressing film to the surface of the substrate opposite the film growth surface. After the film has been grown on the bowed substrate, the bow may be released, or not, as desired. Releasing the bow will induce a bending strain into the film as described above.

In addition, the present aspect may also be used to reduce thermal strains within a film grown on a substrate. Certain combinations of film and substrate materials may not be successfully used with one another because of a large mismatch between their thermal expansion coefficients. Since films are typically grown at temperatures much higher than the temperatures at which the films will eventually operate, the films and corresponding substrates undergo a large temperature change that can cause large, and sometimes destructive, strains within the films. For example, if a film has a large thermal expansion coefficient relative to the substrate, cooling the film and substrate from the growth temperature to the operating temperature causes large tensile strains within the film as it contracts faster than the substrate. These tensile strains can be so large that the film cracks and/or delaminate from the substrate. Conversely, if a film has a small thermal expansion coefficient relative to the substrate, cooling the film and substrate from the growth temperature to the operating temperature causes large compressive strains within the film as it contracts slower than the substrate. These compressive strains can be so large the film cracks and spalls from the substrate.

To counteract these thermal strains within a film, a substrate may be bowed, using any one of the embodiments of the present aspects described above, prior to growing the film such that when the bow is released after the film is grown, the strain induced into the film by releasing the bow is opposite the thermal strain. For example, if the film has a larger thermal expansion coefficient than the substrate, the substrate is bowed so that its growth surface is convex. In this manner, the releasing of the bow induces a compressive strain into the film that is opposite the tensile thermal strain induced into film by cooling the film and substrate. Conversely, if the film has a smaller thermal expansion coefficient than the substrate, the substrate is bowed so that its growth surface is concave. In this manner, the releasing of the bow induces a tensile strain into the film that is opposite the compressive thermal strain induced into film by cooling the film and substrate.

Preferably, the bow in the substrate is released as the film and the substrate are cooled from the growth temperature to an operating temperature. However, the bow may be release at another time, such as immediately following deposition. In one embodiment, the rate of release of the bow is such that the strain induced into the film by the releasing of the bow is equal to the thermal strain induced into the films as the film and substrate cool.

A second aspect of the present invention for inducing a desired strain into an HTS film is directed to selectively changing the stoichiometric composition of the substrate, or a portion thereof, on which the HTS film is epitaxially grown. The stoichiometric composition is changed after the HTS film has been grown, e.g., by implanting certain particles, such as ions, into the substrate from the side of the substrate opposite the HTS film or by diffusing atoms into or out of the substrate. Preferably, the HTS film is deposited commensurately with the substrate, thereby minimizing the growth energy of the HTS film and increasing the quality of the HTS film.

Figure 6A:
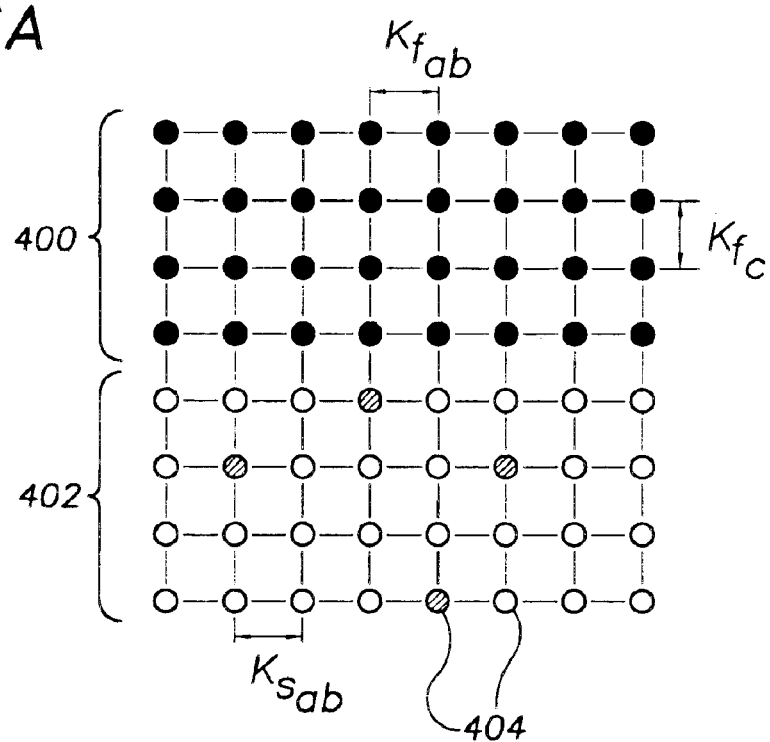
FIGS. 6A and 6B are partial cross-sectional views of the lattice structures of a substrate and an HTS film epitaxially grown thereon, illustrating a second aspect of the present invention wherein the $T_c$ of the HTS film is increased by changing the composition of the substrate.
Figure 6B:
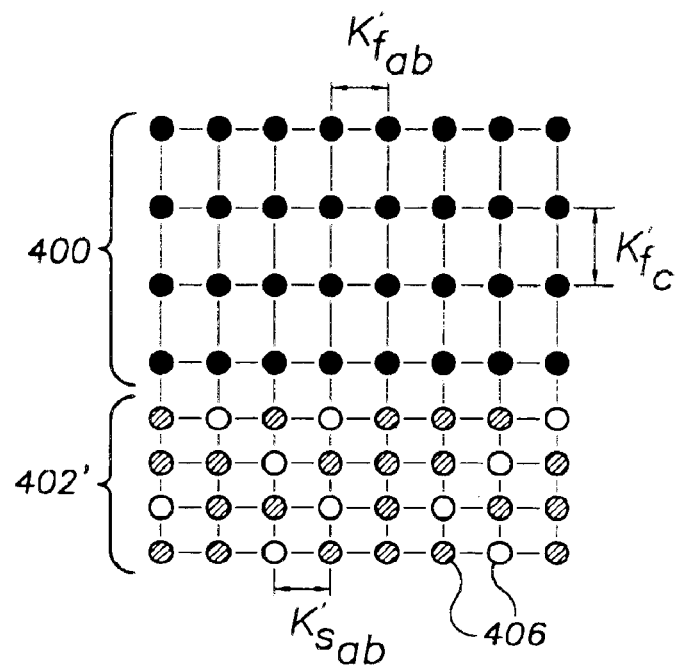

To illustrate this aspect, FIG. 6A shows an HTS film 400 epitaxially grown on a substrate 402 made of a material having a first composition 404, which is represented in FIG. 6A by the particular ratio of shaded to un-shaded circles in the substrate. Substrate 402 is selected such that it has a larger lattice constant at first composition 404 than at a second composition 406, which is illustrated as 402' in FIG. 6B by the different ratio of shaded to unshaded circles in the substrate. First, HTS film 400 is grown, preferably commensurate with substrate 402 of first composition 404. Then, the composition of substrate 402 is changed by implanting or diffusing into or out of the substrate particles that change the composition of the substrate from first composition 404 to second composition 406, thereby reducing the lattice constant of the substrate from $K_{s_{ab}}$ to $K'_{s_{ab}}$. This reduction in lattice constant causes a commensurate decrease in the a-b lattice constant of HTS film 400 from $K_{f_{ab}}$ to $K'_{f_{ab}}$ and, due to the Poisson effect, an increase in the c-direction lattice constant of the HTS film from $K_{f_c}$ to $K'_{f_c}$. These changes in lattice constants and of the HTS film 400 are accompanied by corresponding residual compressive strain in the a-b plane and residual tensile strain in the c-direction that increase the $T_c$ of the HTS film.

Figure 7A:
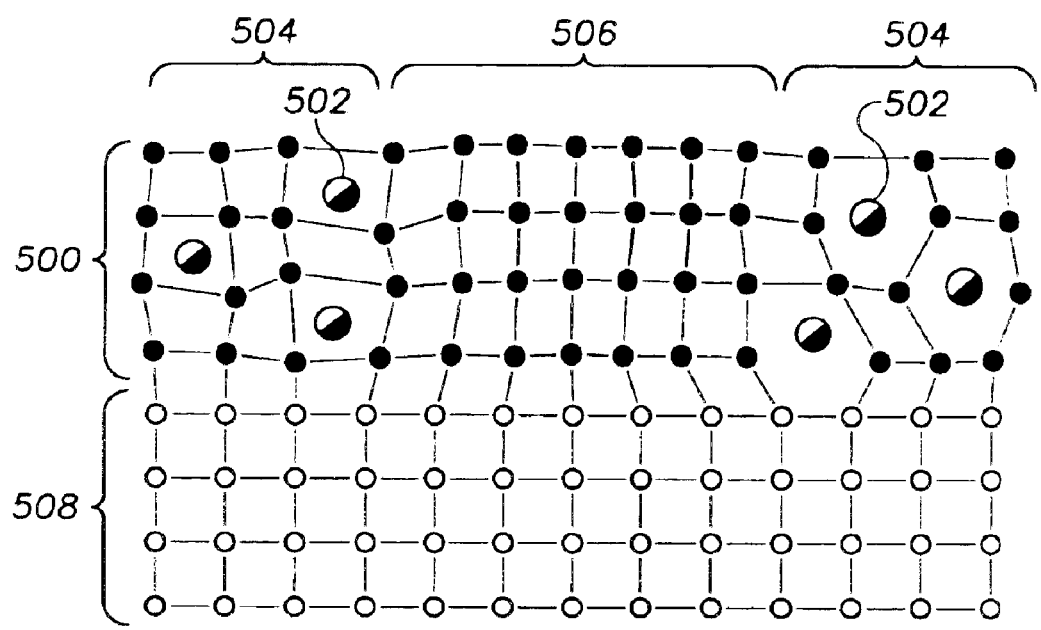
FIGS. 7A–7C are partial cross-sectional views of the lattice structures of a substrate and an HTS film epitaxially grown thereon, illustrating a third aspect of the present invention wherein the $T_c$ of the HTS film is increased by implanting ions into the HTS film.

Referring now to FIG. 7A, a third aspect of the present invention for increasing the $T_C$ of an HTS film 500 comprises adding ions 502, such as gold ions and/or oxygen ions, among others, into one or more regions 504 of the HTS film after the HTS film has been grown. Ions 502 may be added to regions 504 by known methods such as ion implantation and diffusion. By adding a sufficient number of ions 502 of one or more types, the original lattice of HTS film 500 in regions 504 is forced to expand, compressing the lattice structure in adjacent region 506. Compressing the lattice structure in regions 506 causes a residual compressive strain in the a-b plane and a residual tensile strain in the unconstrained c-direction of HTS film 500 that, in turn, induce an increase in the $T_C$ in the region 506. The superconducting properties of HTS film 500 in regions 506 are typically destroyed by additional ions 502.

Figure 7B:
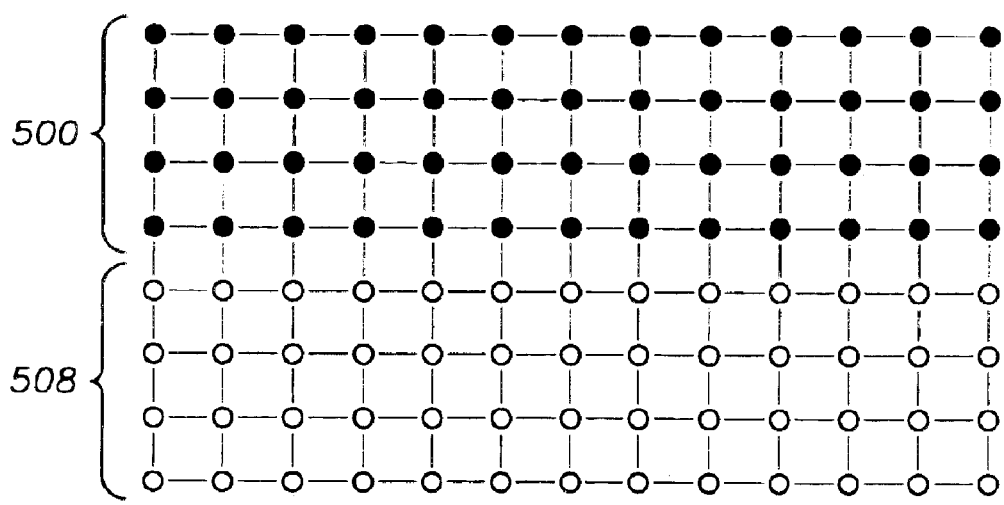

FIG. 7B shows HTS film 500 that has been epitaxially grown on a substrate 508. Preferably and as illustrated, HTS film 500 is grown commensurate with substrate 508 to minimize the growth energy and maximize the quality of the HTS film. Whether HTS film 500 is commensurate or not with respect to substrate 508, however, the lattice constants in the a-b plane and c-direction are generally uniform throughout the HTS film.

Referring again to FIG. 7A, there is shown one embodiment of the present aspect, wherein ions 502 have been added interstitially, e.g., by ion implantation, into the lattice structure of the HTS film 500 at regions 504. Interstitial implantation occurs when ions 502 do not replace the atoms of the HTS film 500, but rather are located in the interstices among adjacent atoms of the original lattice structure.

Figure 7C:
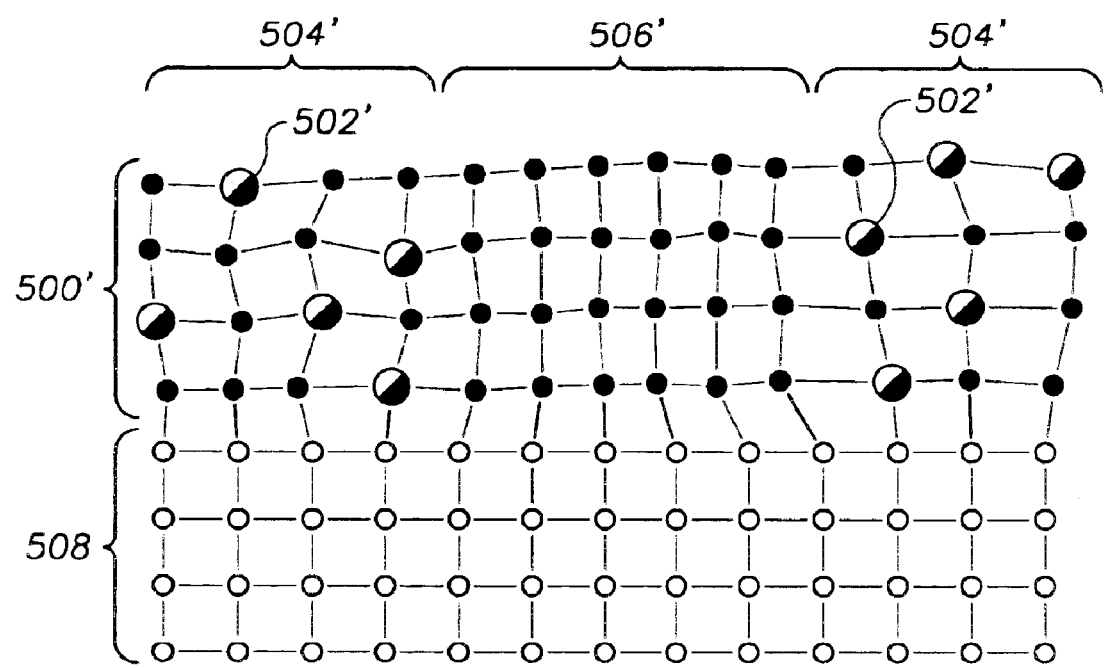

Alternatively, as shown in FIG. 7C, ions 502' have been added to achieve replacement implantation, e.g., by diffusion, wherein the implanted ions replace atoms of the original lattice structure within HTS film 500'. In this embodiment, ions 502' are selected such that their size and/or charge causes the lattice to expand. In another embodiment (not shown), the addition of ions may result in a combination of interstitial and replacement implantation. Whichever implantation technique is selected, HTS films 500, 500' in implanted regions 504, 504' generally loose their superconducting properties due to the alteration of the original lattice.

To implant ions only into implanted regions 504, 504', the upper surface 512, 512' of HTS film 500, 500' must be masked with a patterned mask (not shown) that covers un-implanted regions 506, 506' and leaves the implanted regions uncovered to permit implanting ions 502, 502'. Such masking may be performed using conventional masking and patterning techniques. The mask pattern may be any desired to form a particular device. For example, un-implanted region 506, 506' may be a narrow superconducting channel extending perpendicular to the plane of the respective figure. Preferably, the width W of un-implanted region 506, 506' is on the order of several atomic layers, e.g., on the order of several hundred angstroms, so that the un-implanted region is relatively uniformly stressed between implanted regions 504, 504'. If width W becomes too large relative to the amount of expansive strain in implanted regions 504, 504', it is likely that the strain imparted into un-implanted region 506, 506' will be diminished significantly or entirely at the midpoint between the implanted regions. After ions 502, 502' have been implanted, the mask is removed.

Figure 8A:
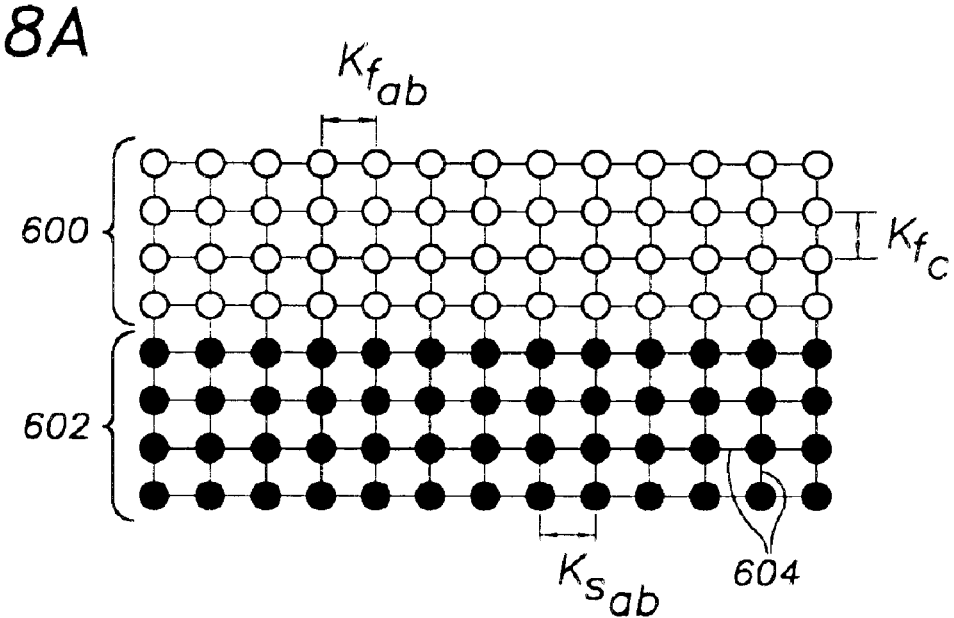
FIGS. 8A and 8B are partial cross-sectional views of the lattice structures of a substrate and an HTS film epitaxially grown thereon, illustrating a fourth aspect of the present invention wherein the $T_c$ of the HTS film is increased by causing the substrate to undergo a phase transformation.
Figure 8B:
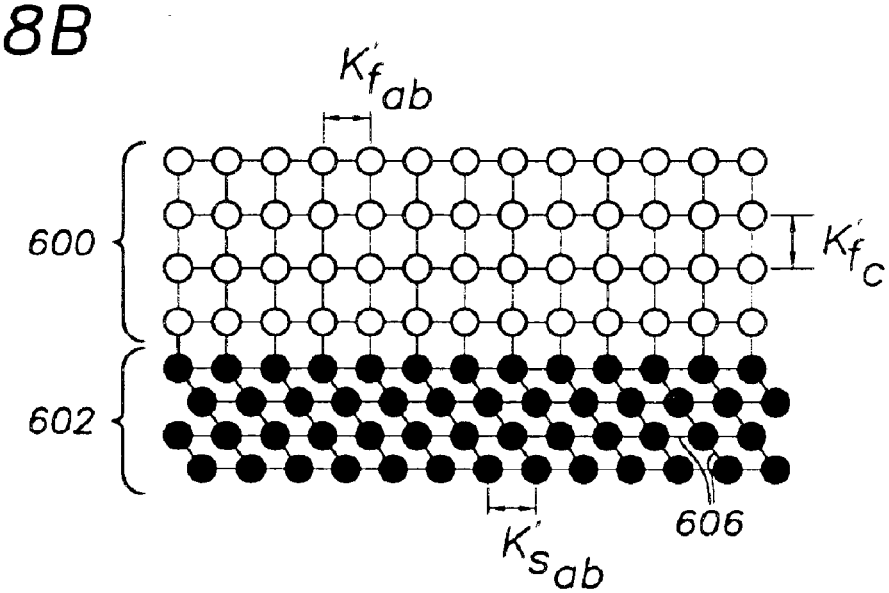

Referring now to FIGS. 8A and 8B, a fourth aspect of the present invention for increasing the $T_c$ of an HTS film comprises growing an HTS film 600 on a substrate 602 while the material of the substrate is in a first phase 604 (FIG. 8A) and then causing a phase transformation that causes the substrate material to change to a second phase 606 (FIG. 8B). In first phase 604, the a-b lattice constant $K_{s_{ab}}$ of substrate 602 is preferably the same as the a-b lattice constant $K_{f_{ab}}$ of HTS film 600. Accordingly, HTS film 600 is preferably grown commensurate with substrate 602 so that the HTS film may be of a high quality. In second phase 606, the arrangement of atoms in substrate 602 is different from the arrangement of atoms therein in first phase 604 such that the a-b lattice constant $K'_{s_{ab}}$ in the second phase is smaller than lattice constant $K_{s_{ab}}$ in the first phase. The reduction in the a-b lattice constant of substrate 602 causes a reduction in the a-b plane lattice constant of HTS film 600 from $K_{f_{ab}}$ to $K'_{f_{ab}}$, inducing a residual compressive strain into the a-b plane of the film. Due to the Poisson effect, the residual compressive strain in the a-b plane of HTS film 600 causes a corresponding increase in the c-direction lattice constant of the HTS film from $K_{f_c}$ to $K'_{f_c}$ and a corresponding residual tensile strain into the c-direction of the HTS film. These residual strains in turn cause an increase in the $T_c$ of HTS film 600.

Figure 9:
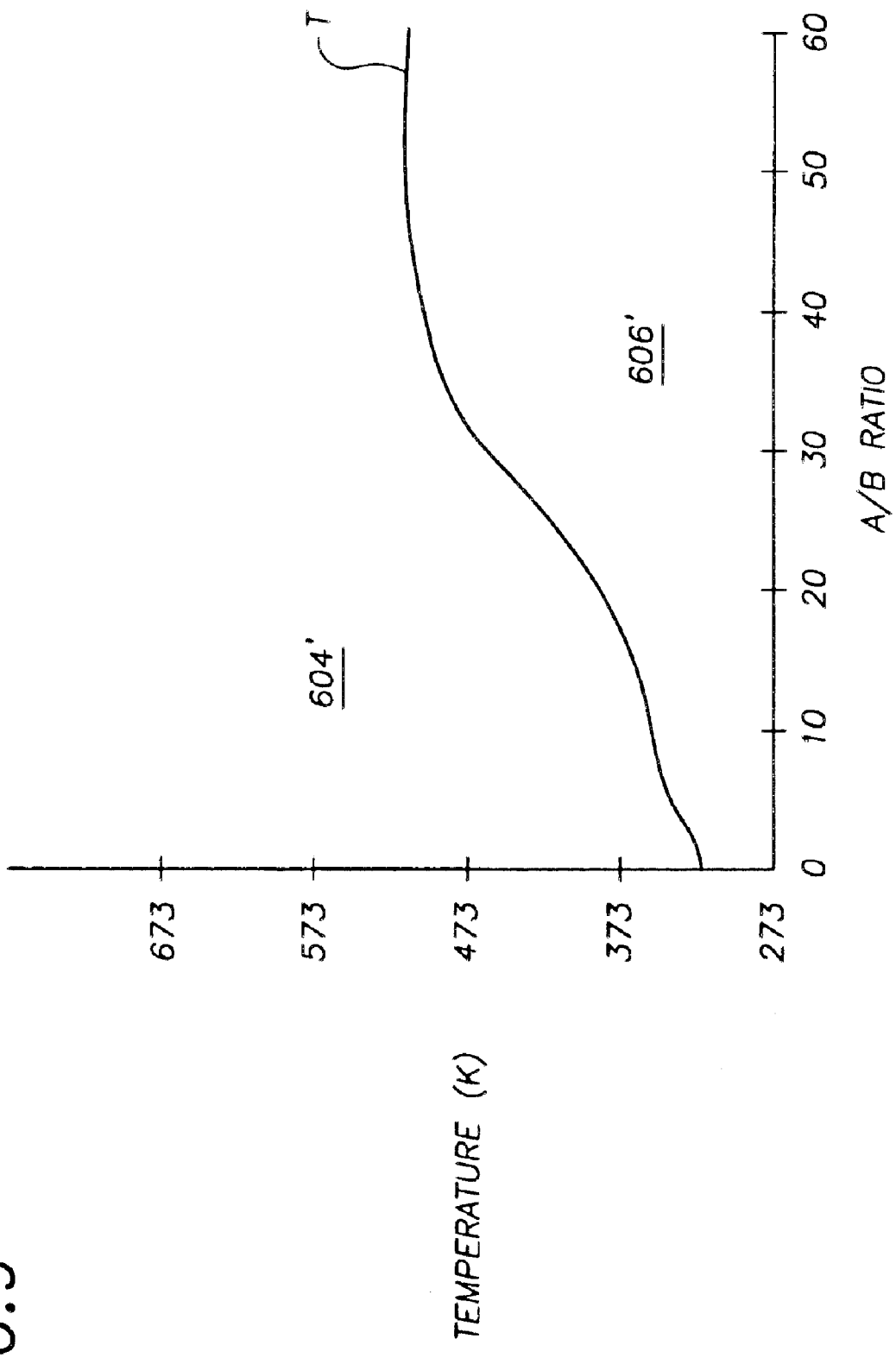
FIG. 9 is a phase diagram of a crystalline material that may be used with the third aspect of the present invention.

The phase transformation between first phase 604 and second phase 606 may be caused by a change in one or more of the temperature of substrate 602, the pressure to which the substrate is subjected and the composition of the substrate. For example, FIG. 9 shows a simplified phase diagram for a ficticious crystalline material that comprises a first material A and a second material B. At a particular stoichiometric composition of material A and material B, the crystalline material experiences the desired reduction in lattice constant between a first phase 604' and a second phase 606' at a certain temperature as the crystalline material transitions from the first phase to the second phase through transition boundary T. For example, at a composition of 30% A and 70% B, the transition temperature between first phase 604' and second phase 606' is about 473 K. As crystalline material passes through transition boundary $T_c$ the crystalline material experiences an abrupt reduction in the lattice constant that is due to the rearrangement of the crystal structure within the crystalline material as the material passes through transition boundary T. This abrupt reduction is independent of the reduction due to the coefficient of thermal expansion As the lattice constant of substrate 602 reduces as the crystalline material passes through transition boundary $T_c$ the lattice structure of HTS film 600 is commensurately compressed, thereby inducing $T_c$ raising residual strains into the HTS film.

One skilled in the art will understand that the phase diagram shown in FIG. 9 is merely illustrative. Actual materials typically have much more complex phase diagrams. One skilled in the art will also recognize that techniques, such as rapid cooling, may be used to alter the structure of a selected material from the structure that would otherwise result at a particular temperature.

Figure 10A:
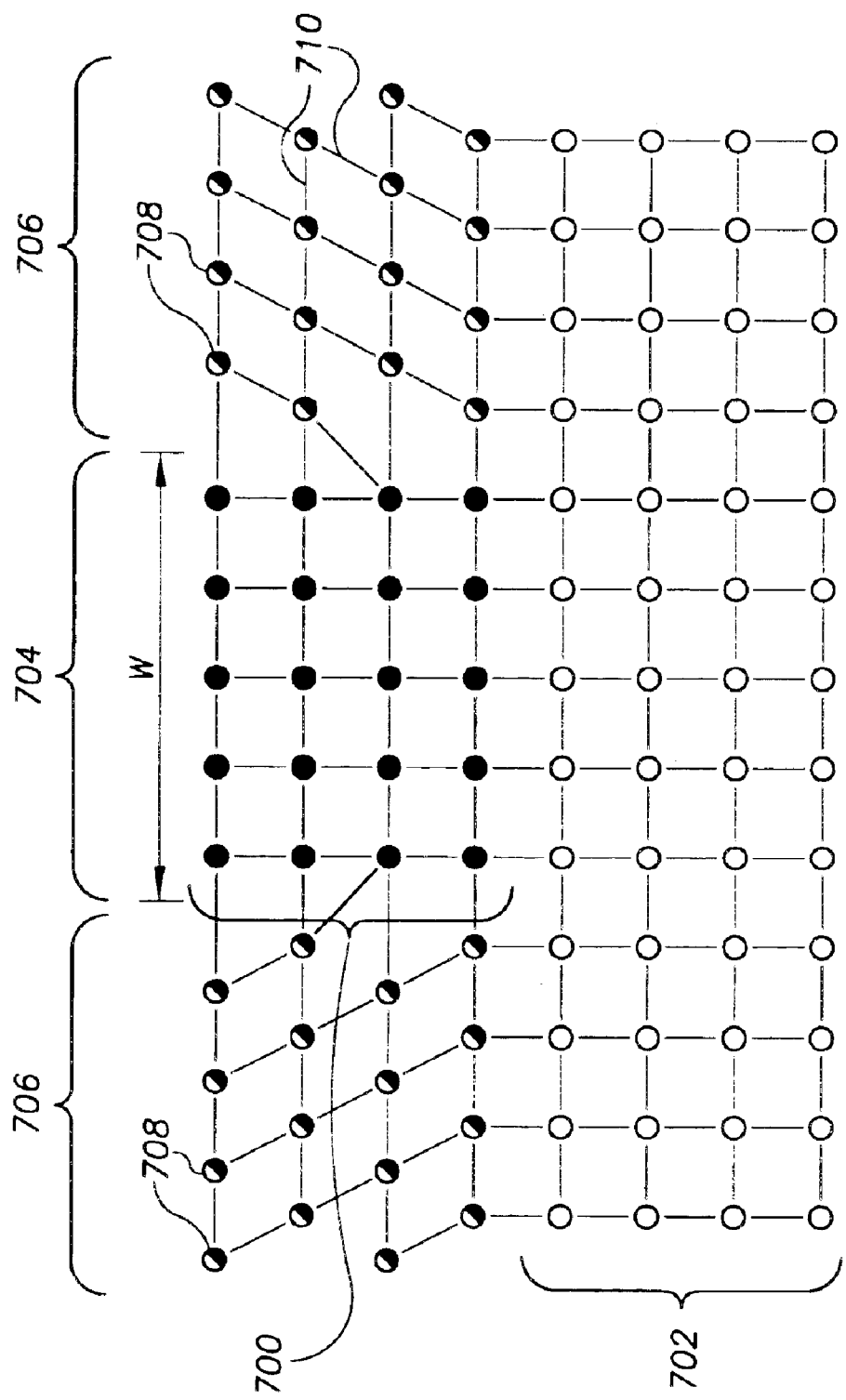
FIGS. 10A and 10B are partial cross-sectional views of the lattice structures of a substrate and an HTS film epitaxially grown thereon, illustrating a fifth aspect of the present invention wherein the $T_c$ of the HTS film is increased by causing material laterally adjacent the HTS film to undergo a phase change.
Figure 10B:
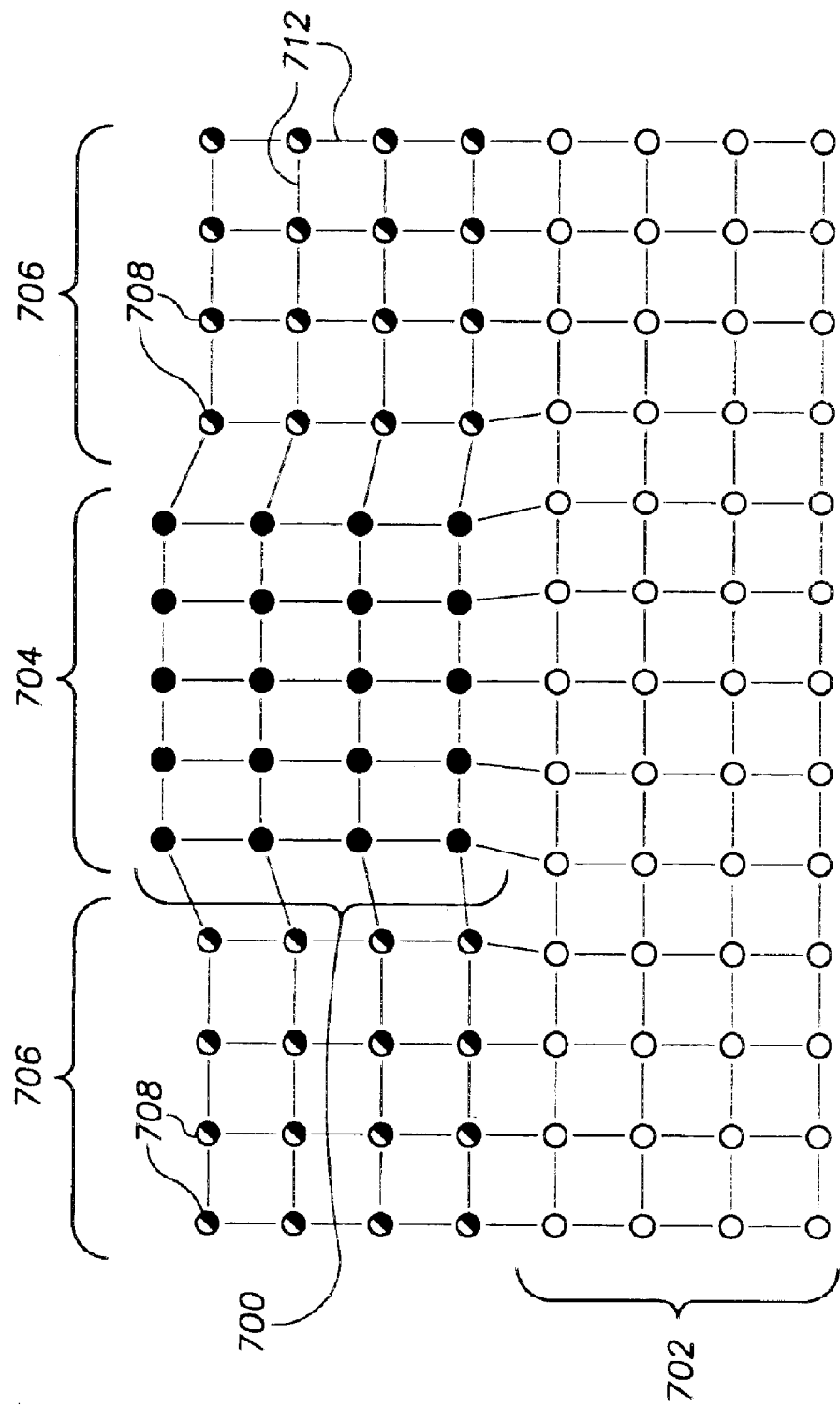

In a fifth aspect of the present invention, as shown in FIGS. 10A and 10B, the $T_c$ of an HTS film 700 may be increased by first epitaxially growing the HTS film on a substrate 702 and then patterning and etching the HTS film using known techniques to form one or more superconducting regions 704. Preferably, HTS film layer 700 is grown commensurate with substrate 702, as illustrated, to produce a high quality film. If desired, substrate 702 may include another layer (not shown) made of, e.g., YSZ, located adjacent HTS film 700, similar to superconductor structure 100 shown in FIG. 3. A YSZ layer could provide a buffer for HTS film 700 and also be an etch stop for patterning superconducting region 704 since YSZ is resistant to a number of etchants that may be used for patterning the HTS film. Superconducting region 704 containing a material 708 grown on substrate 702 in a first phase 710 and having a lattice constant that increases upon going through a phase transformation from first phase 710 to a second phase 712, as shown in FIG. 10B.

To form the structure shown in FIG. 10A, e.g., HTS film 700 may first be grown and then patterned to form superconducting region 704. Then, material 708 may then be grown upon substrate 702 at regions 706 and upon HTS film 700 at superconducting region 704. After material 708 has been grown, the resulting structure may then be chemical-mechanical polished to remove material 706 grown on top of superconducting region 704 so that the upper surfaces of HTS film 700 and material 708 at regions 706 are substantially co-planar.

After the composite structure has been chemical-mechanical polished, material 708 is then caused to go through a phase transformation that increases the lattice constant of the expanding material. As the lattice constant of material 708 increases from first phase 710 to second phase 712, material 708 compresses HTS film 700 in superconducting region 704. As the HTS film 700 is compressed in the a-b plane, a residual compressive strain is induced into the a-b plane and, due to the Poisson effect, a corresponding residual tensile strain is induced into the c-direction of the HTS film, thereby inducing an increase in the $T_c$ of the HTS film above the $T_c$ of the unstrained HTS film.

Similar to the embodiment of FIGS. 8A and 8B, phase transformation may occur through a change in temperature, pressure and/or composition of material 708. For example, at a first temperature, e.g., the temperature at which material 708 is grown, the material may have a lattice constant of 5.40 Å. At a second temperature, e.g., the operating temperature of a device incorporating HTS film 700, the lattice constant of material 708 may be 5.80 Å. Thus, as material 708 is cooled from the growing temperature to the operating temperature, it expands approximately 7.5%, compressing HTS film 700 in it's a-b plane at regions 704 by a commensurate amount.

Superconducting region 704 may be a narrow superconducting channel extending perpendicular to the plane of the figure. Preferably, the width W of superconducting region 704 is on the order of several atomic layers, e.g., on the order of several hundred angstroms, so that the superconducting region is relatively uniformly stressed between adjacent regions 706 of material 708. If width W becomes too large relative to the amount of expansive strain in regions 706, it is likely that the residual strain imparted into superconducting region 704 will be diminished significantly, or entirely, at the midpoint between the regions 706 such that the expected increase in $T_c$ may not be achieved.

Figure 11A:
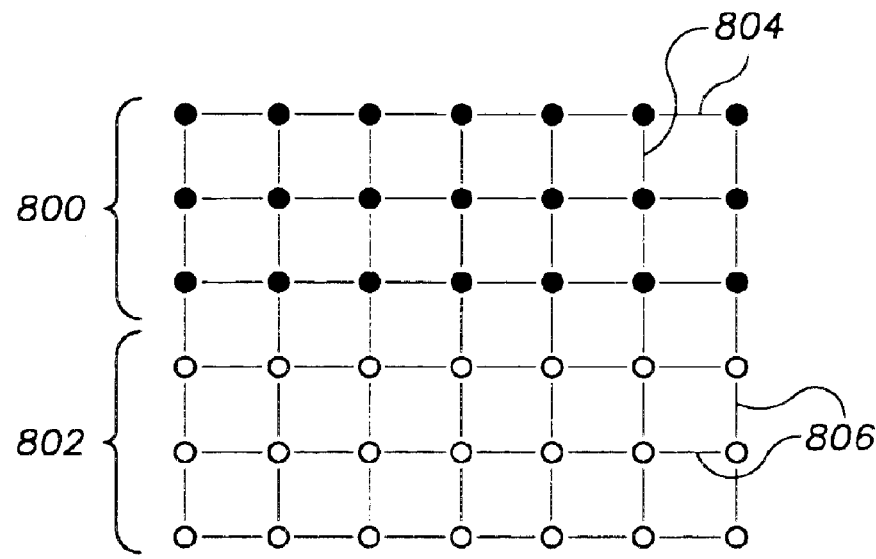
FIGS. 11A and 11B are partial cross-sectional views of the lattice structures of a substrate and an HTS film epitaxially grown thereon, illustrating a sixth aspect of the present invention wherein the $T_c$ of the HTS film is increased by a coefficient of thermal expansion mismatch between the substrate and HTS film.
Figure 11B:
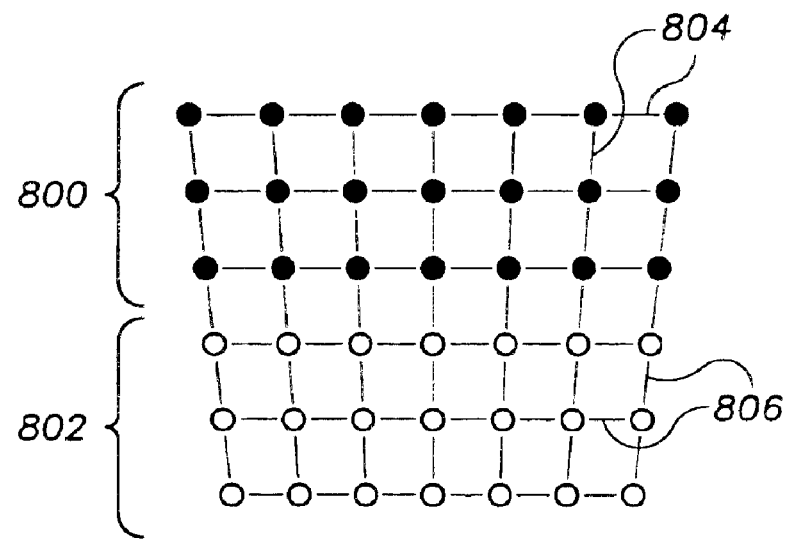

As shown in FIGS. 11A and 11B, a sixth aspect of the present invention for increasing the $T_c$ of an HTS film 800 comprises growing the HTS film on a substrate 802 made of a material having a coefficient of thermal expansion (CTE) that is relatively large compared to the CTE of the HTS film. The material for substrate 802 is selected such that when the substrate cools from the temperature at which HTS film 800 is grown to the particular operating temperature of the device incorporating HTS film, the relative difference in contraction of the lattice structure of substrate 802 with respect to the lattice structure of HTS film causes a compressive strain in the a-b plane of the HTS film. Since HTS film 800 is unconstrained in its c-direction, a residual compressive strain in a-b plane of the HTS film induces a corresponding residual tensile strain in the c-direction of the HTS film. This state of strain in HTS film 800, in turn, causes an increase in the $T_C$ of the HTS film. For a particular substrate material, the amount of strain, and, therefore increase in T¢, induced into HTS film 800 can be selectively controlled by varying the difference between the temperature at which the HTS film is grown and the operating temperature of the device incorporating the HTS film.

FIG. 11A represents the lattice structures of substrate 802 and HTS film 800 at the temperature at which the HTS film is grown. As illustrated, HTS film 800 is preferably grown substantially commensurate with substrate 802 to maximize the quality of the HTS film. Therefore, the materials for HTS film 800 and substrate 802 are selected such that their lattice constants are substantially equal to one another at the temperature at which the HTS film is grown. These materials are also selected so that the particular combination of variables, such as lattice constants, CTEs, bulk $T_c$ and desired $T_C$ of HTS film 800 after cooling, among others, yield the desired $T_c$ after cooling.

The growing temperature of HTS film 800 is an important variable for varying the amount of strain induced, and therefore increase in $T_0$, into the HTS film via the lattice mismatch between the HTS film and substrate 802. Thus, it is desirable to be able to grow the HTS film over a range of temperatures using known methods such as pulsed laser deposition, chemical vapor deposition (CVD) plasma-enhanced CVD, and reactive sputtering (RS), among others.

FIG. 11B shows the state of the lattice structures 804, 806, respectively, of HTS film 800 and substrate 802 at the operating temperature of a device incorporating the HTS film and substrate. For example, the operating temperature may be on the order of 190 K if the $T_C$ of HTS film has been raised above 190 K. As seen in FIG. 11B, the lattice structure of substrate 802 is smaller than it was at the film growing temperature. As HTS film 800 and substrate 802 cooled, lattice structure 806 of substrate 802 contracted faster that lattice structure 804 of HTS film 800. However, due to the relatively large bond energy between the atom of lattice structures 804 and 806 at the interface between the two lattice structures, rather than the lattice structures slipping relative to one another, lattice structure 804 generally conforms with lattice structure 806, thereby inducing a compressive strain into the a-b plane, and commensurate tensile strain into the c-direction, of HTS film 800. This state of strain within HTS film 800 increases the $T_C$ of the HTS film.

While the present invention has been described in connection with the above described embodiments, it will be understood that it is not so limited. On the contrary, it is intended to cover all alternatives, modifications and equivalents as may be included within the spirit and scope of the invention as defined in the appended claims.

What is claimed is:

1. A superconducting structure, comprising:

a) a substrate having a surface;

b) an HTS film grown on said surface and having an a-b plane parallel to said surface and a c-direction normal to said surface, said HTS film having a residual compressive strain in said a-b plane and a residual tensile strain in said c-direction, wherein said residual compressive and tensile strains are not caused by a lattice mismatch between said substrate and said HTS film.

2. A superconducting structure according to claim 1, wherein said HTS film has a thickness of at least 500 Å in a direction normal to said surface of said substrate, said residual compressive and tensile strains being substantially uniform throughout said thickness.

3. A superconducting structure according to claim 2, wherein said thickness is at least 1000 Å.

4. A superconducting structure, comprising:
a) a substrate having a surface;
b) an HTS film grown on said surface and having a thickness normal to said surface, an a-b plane parallel to said surface and a c-direction normal to said surface, said thickness being greater than the maximum thickness to which said HTS film can be pseudomorphically grown before pseudomorphic strain is released by dislocations occurring in said HTS film, said HTS film having a residual compressive strain in said a-b plane and a residual tensile strain in said c-direction that are generally uniform throughout said thickness.

5. A superconducting structure according to claim 4, wherein said thickness is at least 500 Å.

6. A superconducting structure according to claim 5, wherein said thickness is at least 1000 Å.

7. A superconducting structure, comprising:
a) a substrate having a surface;
b) an HTS film grown on said surface and having an a-b plane parallel to said surface and a c-direction normal to said surface, said HTS film having a compressive strain in said a-b plane and a tensile strain in said c-direction, wherein said compressive and tensile strains induce into said HTS film a $T_c$ higher than that achievable by pseudomorphic epitaxy.

8. A structure, comprising:
a) a first substrate having a substantially unbowed first surface and a first bulk lattice constant; and
b) a first film made of a material having a second bulk lattice constant different from said first bulk lattice constant, said first film grown on said first surface and having fewer dislocations than achievable by growing a second film made of said material on a second surface of a second substrate when the second surface has a surface lattice constant equal to said first bulk lattice constant.

9. The structure according to claim 8, wherein said first film has a substantially dislocation free thickness greater than achievable by growing a second film made of said material on a second surface of a second substrate when the second surface has a surface lattice constant equal to said first bulk lattice constant.

10. The structure according to claim 8, wherein said material is an HTS material.

11. A structure comprising:
a) a first substrate having a first thermal expansion coefficient; and
b) a first film grown on said first substrate at a growth temperature wherein said first substrate and said second substrate are at said growth temperature, said first film comprising a material having a second thermal expansion coefficient different from said first thermal expansion coefficient, said film having an operating temperature different from said growth temperature and a thermal strain at said operating temperature, said thermal strain being less than would occur by growing at said growth temperature a second film made of said material on a second substrate having said first thermal expansion coefficient and cooling said second film and said second substrate to said operating temperature.

12. A structure according to claim 11, wherein said material is an HTS material.

* * * * *